US010784299B2

(12) United States Patent
Hara et al.

(10) Patent No.: US 10,784,299 B2
(45) Date of Patent: Sep. 22, 2020

(54) PHOTOELECTRIC CONVERSION APPARATUS AND EQUIPMENT

(71) Applicant: CANON KABUSHIKI KAISHA, Tokyo (JP)

(72) Inventors: Koji Hara, Ichikawa (JP); Toshiyuki Ogawa, Abiko (JP); Hajime Ikeda, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/156,442

(22) Filed: Oct. 10, 2018

(65) Prior Publication Data
US 2019/0115383 A1 Apr. 18, 2019

(30) Foreign Application Priority Data
Oct. 13, 2017 (JP) ................. 2017-199604

(51) Int. Cl.
*H01L 27/146* (2006.01)
(52) U.S. Cl.
CPC .. *H01L 27/14623* (2013.01); *H01L 27/14603* (2013.01); *H01L 27/14612* (2013.01); *H01L 27/14643* (2013.01)
(58) Field of Classification Search
CPC .............................................. H01L 27/14612
See application file for complete search history.

(56) References Cited

U.S. PATENT DOCUMENTS

| 7,720,580 B2* | 5/2010 | Higgins-Luthman ..... B60R 1/00 701/28 |
| 2014/0091378 A1* | 4/2014 | Hashimoto ....... H01L 27/14623 257/294 |
| 2014/0094030 A1* | 4/2014 | Shimotsusa ........... H01L 21/768 438/652 |
| 2015/0264283 A1* | 9/2015 | Kobayashi ............. H04N 5/361 257/229 |

(Continued)

FOREIGN PATENT DOCUMENTS

| JP | 09-092809 A | 4/1997 |
| JP | 2004-241495 A | 8/2004 |
| JP | 2011-204992 A | 10/2011 |

(Continued)

OTHER PUBLICATIONS

Hatton, B. "Materials chemistry for low-k materials" materialstoday vol. 9, Iss. 3 Mar. 2006 pp. 22-31 (Year: 2006).*

*Primary Examiner* — Grant S Withers
(74) *Attorney, Agent, or Firm* — Canon U.S.A., Inc. IP Division

(57) ABSTRACT

Provided is a photoelectric conversion apparatus including: an interlayer insulating film that covers a semiconductor layer and has a contact hole positioned above a gate electrode; a contact plug that is disposed in the contact hole and connected to the gate electrode; a light-shielding film that is positioned between the interlayer insulating film and the semiconductor layer and includes a first part covering a charge holding portion and a second part covering an upper surface of the gate electrode; and a dielectric layer that is positioned between the second part and the gate electrode, in which a relative dielectric constant of the dielectric layer is lower than a relative dielectric constant of the interlayer insulating film.

23 Claims, 3 Drawing Sheets

(56) References Cited

U.S. PATENT DOCUMENTS

2018/0366505 A1* 12/2018 Ogawa .............. H01L 27/14623

FOREIGN PATENT DOCUMENTS

| | | |
|---|---|---|
| JP | 2011-249406 A | 12/2011 |
| JP | 2014-075378 A | 4/2014 |
| JP | 2015-146364 A | 8/2015 |
| JP | 2016-027660 A | 2/2016 |
| JP | 2016-219792 A | 12/2016 |
| JP | 2017-103341 A | 6/2017 |
| JP | 2017-183407 A | 10/2017 |

* cited by examiner

PHOTOELECTRIC CONVERSION APPARATUS AND EQUIPMENT

BACKGROUND OF THE INVENTION

Field of the Invention

The present disclosure relates to a photoelectric conversion apparatus that includes a light-shielding film.

Description of the Related Art

In a CMOS image sensor, by providing a charge holding portion that holds electric charge generated in a photoelectric conversion portion, it is possible to realize a global electronic shutter function. The charge holding portion is covered by a light-shielding film so that light does not enter the charge holding portion during a charge holding period.

Japanese Patent Laid-Open No. 2016-219792 describes that a light-shielding member covers a charge holding portion and gate electrodes of transistors of a pixel circuit.

When, in order to enhance light-shielding performance, an area of a light-shielding film is increased or the light-shielding film is brought closer to a semiconductor layer, a parasitic capacitance due to the light-shielding film is easily added to a gate electrode. By examination of the present inventor, it has been newly found that the parasitic capacitance due to the light-shielding film affects an operation of a pixel circuit and disturbs improvement of performance of a photoelectric conversion apparatus.

SUMMARY OF THE INVENTION

The disclosure improves performance of a photoelectric conversion apparatus.

A first aspect of the present disclosure is a photoelectric conversion apparatus including: a semiconductor layer that includes a photoelectric conversion portion, a charge holding portion which holds electric charge generated by the photoelectric conversion portion, and a charge detection portion to which the electric charge held by the charge holding portion is transferred; a gate electrode of a transistor, which is disposed on the semiconductor layer; an insulator film that covers the semiconductor layer and has a contact hole positioned above the gate electrode; a contact plug that is disposed in the contact hole and connected to the gate electrode; a light-shielding film that is positioned between the insulator film and the semiconductor layer and includes a first part covering the charge holding portion and a second part covering an upper surface of the gate electrode; and a dielectric layer that is positioned between the second part and the gate electrode, in which a relative dielectric constant of the dielectric layer is lower than a relative dielectric constant of the insulator film.

A second aspect of the present disclosure is a photoelectric conversion apparatus including: a semiconductor layer that includes a photoelectric conversion portion, a charge holding portion which holds electric charge generated by the photoelectric conversion portion, and a charge detection portion to which the electric charge held by the charge holding portion is transferred; a gate electrode of a transistor, which is disposed on the semiconductor layer; a light-shielding film that includes a first part covering the charge holding portion and a second part covering an upper surface of the gate electrode; and a dielectric layer that is positioned between the second part and the gate electrode, in which the dielectric layer is formed of a low-k material.

Further features of the present disclosure will become apparent from the following description of exemplary embodiments with reference to the attached drawings.

DESCRIPTION OF THE EMBODIMENTS

Hereinafter, a form for implementing the disclosure will be described with reference to drawings. Note that, in description and drawings below, common reference signs will be assigned to common components through a plurality of drawings. Therefore, the common component will be described by mutually referring to the plurality of drawings, and description for the components to which the common reference signs are assigned will be appropriately omitted.

Moreover, it is possible to distinguish between components, which have similar names and to which different reference signs are assigned, by referring to the components as a first component, a second component, a third component, or the like.

First Embodiment

Figure 1A:
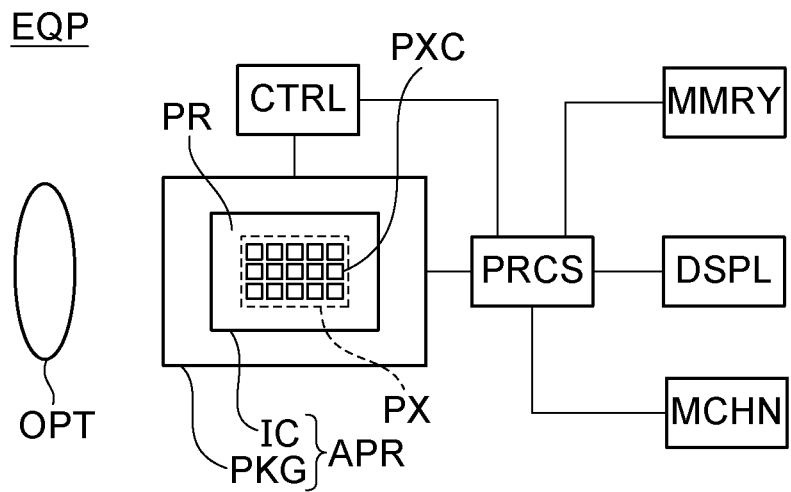
FIGS. 1A and 1B are schematic views for explaining a photoelectric conversion apparatus and equipment.

FIG. 1A is a schematic view of equipment EQP that includes a photoelectric conversion apparatus APR according to an embodiment of the disclosure. The photoelectric conversion apparatus APR includes a semiconductor device IC. The semiconductor device IC is a semiconductor chip in which a semiconductor integrated circuit is provided. In addition to the semiconductor device IC, the photoelectric conversion apparatus APR is able to include a package PKG that stores the semiconductor device IC. The photoelectric conversion apparatus APR is able to be used as an image sensor, an AF (Auto Focus) sensor, a photometric sensor, or a ranging sensor.

The equipment EQP may further include at least any one of an optical system OPT, a control apparatus CTRL, a processing apparatus PRCS, a display apparatus DSPL, a memory apparatus MMRY, and a machine apparatus MCHN. Details of the equipment EQP will be described later.

The semiconductor device IC includes a pixel region PX in which pixel circuits PXC each of which includes a photoelectric conversion portion are two-dimensionally arrayed. The semiconductor device IC is able to include a peripheral region PR around the pixel region PX. Moreover, in the peripheral region PR, it is possible to arrange a drive circuit for driving the pixel circuits PXC, a signal processing circuit for performing processing for a signal from the pixel circuits PXC, and a control circuit for controlling the drive circuit and the signal processing circuit. The signal processing circuit is able to perform signal processing such as correlated double sampling (CDS) processing, amplification processing, or AD (Analog-Digital) conversion processing. As another example of the semiconductor device IC, it is also possible to arrange at least a part of a peripheral circuit, which is disposed in the peripheral region PR, in a semiconductor layer other than a semiconductor layer in which the pixel region PX is disposed and to laminate the both semiconductor layers.

Figure 1B:
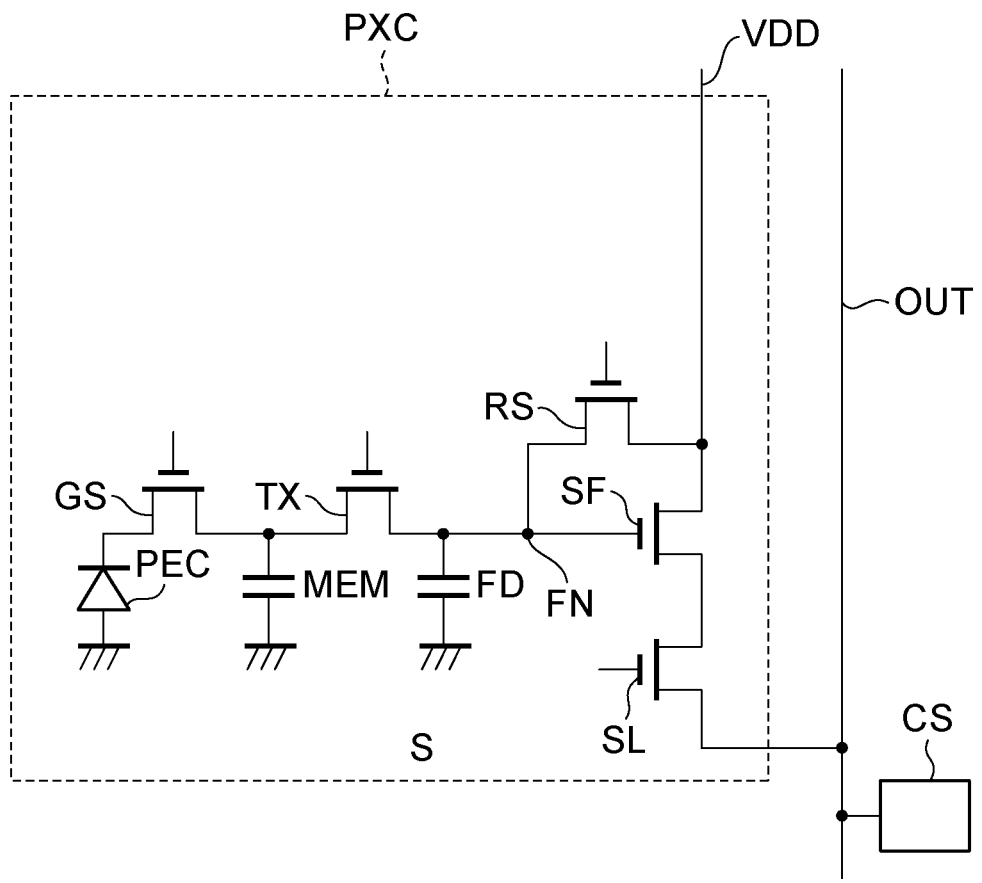

FIG. 1B illustrates an example of a pixel circuit PXC. The pixel circuit PXC includes a photoelectric conversion element PEC, a transfer gate GS, a charge holding capacitance MEM, a transfer gate TX, and a charge detection capacitance FD. Moreover, the pixel circuit PXC is able to include an amplification transistor SF, a reset transistor RS, and a selection transistor SL. Each of photoelectric conversion elements PEC is a photodiode or a photo gate. The charge detection capacitance FD is constituted by a floating diffusion. The transfer gates GS and TX are MIS (Metal-Insulator-Semiconductor) gates, and the amplification transistor SF, the reset transistor RS, and the selection transistor SL are MIS transistors. The amplification transistor SF may be a junction field effect transistor. A plurality of photoelectric conversion elements PEC may share one amplification transistor SF.

Signal charge generated by the photoelectric conversion element PEC is transferred to the charge holding capacitance MEM via the transfer gate GS, and the charge holding capacitance MEM holds the electric charge generated by the photoelectric conversion element PEC. The signal charge held by the charge holding capacitance MEM is transferred to the charge detection capacitance FD via the transfer gate TX. The charge detection capacitance FD is connected to a floating node FN. A gate of the amplification transistor SF that constitutes a source follower circuit with a current source CS is connected to the floating node FN. That is, the gate of the amplification transistor SF is connected to the charge detection capacitance FD via the floating node FN. A pixel signal serving as a voltage signal is output to a signal output line OUT. The reset transistor RS resets electric charge and potential of the floating node FN, and the selection transistor SL switches connection of the amplification transistor SF and the signal output line OUT. The reset transistor RS and the amplification transistor SF are connected to a power supply line VDD. The signal output line OUT and the power supply line VDD are provided for each column of the pixel circuits PXC.

Figure 2A:
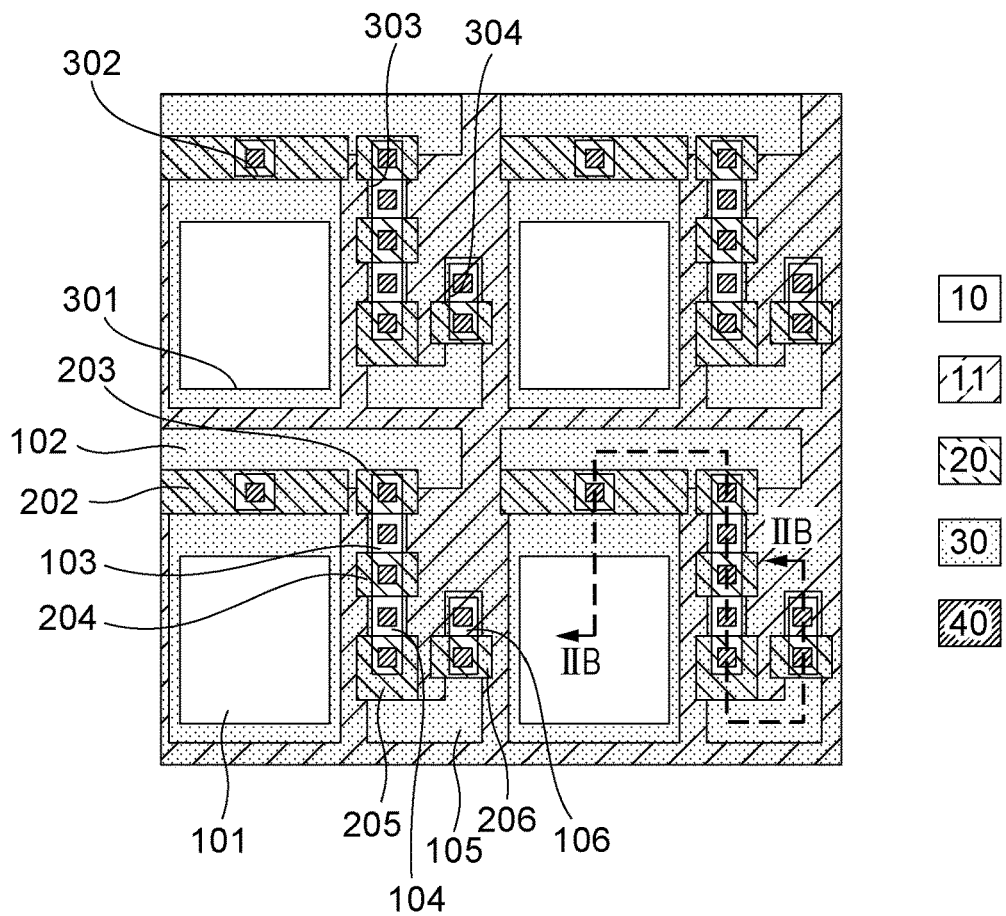
FIGS. 2A and 2B are schematic views for explaining the photoelectric conversion apparatus.
Figure 2B:
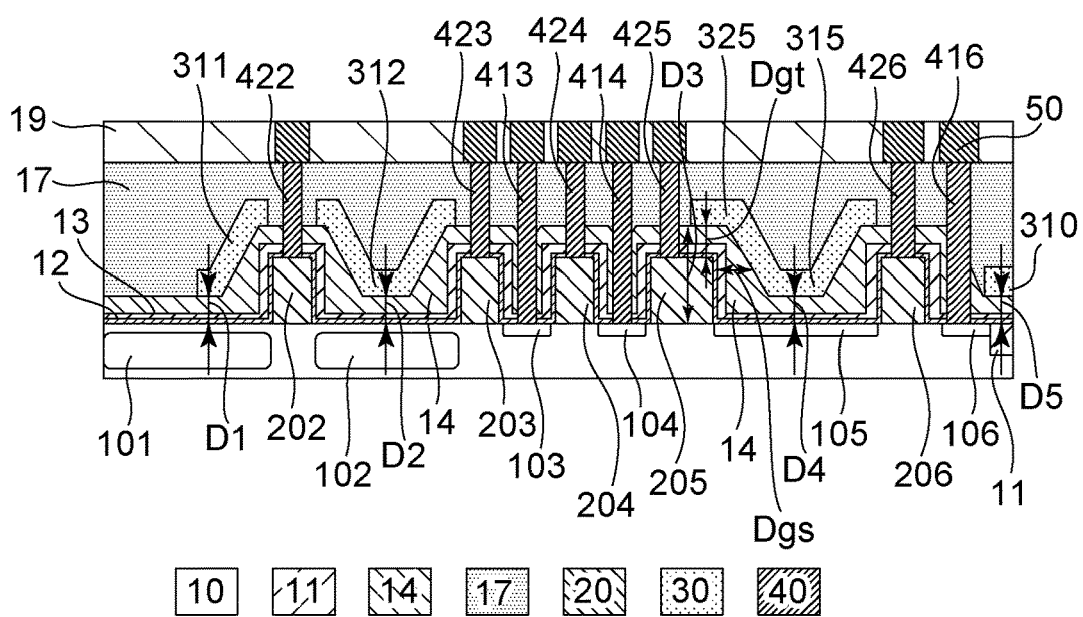

FIG. 2A is a schematic plan view of the pixel circuits PXC. FIG. 2B is a schematic sectional view of the pixel circuit PXC, which is taken along a curved line IIB-IIB in FIG. 2A. FIG. 2A illustrates pixel circuits PXC of four pixels obtained by 2×2. The four pixel circuits PXC have translation symmetry, and reference signs for explaining different matters are assigned for each of the pixels in order to secure visibility of the figure. On the right of FIG. 2A and below FIG. 2B, explanatory notes indicating correspondence between hatching and the reference signs are illustrated. In FIG. 2A, a way of overlapping a plurality of members is illustrated by overlapping of hatching.

The photoelectric conversion apparatus APR includes a semiconductor layer 10, gate electrodes 20 of transistors, which are disposed on the semiconductor layer 10, and a light-shielding film 30 which is disposed on the semiconductor layer 10.

The semiconductor layer 10 is an epitaxial layer on a single-crystal silicon wafer, for example. The semiconductor layer 10 includes a semiconductor region demarcated by an element isolation region 11. The semiconductor layer 10 includes a photoelectric conversion portion 101, a charge holding portion 102, and a charge detection portion 103 each of which is a semiconductor region. The semiconductor layer 10 includes n-type semiconductor regions 104, 105, and 106 each of which functions as a source and/or a drain of a transistor. A semiconductor region serving as a channel region is provided between the photoelectric conversion portion 101, the charge holding portion 102, the charge detection portion 103, and the semiconductor regions 104, 105, and 106. For example, in FIG. 2A, the photoelectric conversion portion 101, the charge holding portion 102, the charge detection portion 103, and the semiconductor regions 104, 105, and 106 are n-type semiconductor regions, and a semiconductor region of the semiconductor layer 10, which excludes the photoelectric conversion portion 101, the charge holding portion 102, the charge detection portion 103, and the semiconductor regions 104, 105, and 106, is a p-type semiconductor region. Note that, in description below, a conductive type that coincides with a conductive type whose majority carrier is electric charge handled as signal charge in the pixel circuit PXC is set as a first conductive type, and a conductive type that coincides with a conductive type whose minority carrier is electric charge handled as signal charge is set as a second conductive type. In a case where an electron is used as signal charge, an n-type is the first conductive type and a p-type is the second conductive type.

The photoelectric conversion portion 101 corresponds to the photoelectric conversion element PEC, the charge holding portion 102 corresponds to the charge holding capacitance MEM, and the charge detection portion 103 corresponds to the charge detection capacitance FD. The charge detection portion 103 is constituted by the n-type semiconductor region that serves as a floating diffusion. The photoelectric conversion portion 101 includes an n-type semiconductor region serving as a charge accumulation region, and a p-type semiconductor region is disposed between the n-type semiconductor region of the photoelectric conversion portion 101 and a surface of the semiconductor layer 10. The p-type semiconductor region on the photoelectric conversion portion 101 suppresses mixing of noise charge (dark current) generated on the surface of the semiconductor layer 10 into the n-type semiconductor region of the photoelectric conversion portion 101. The charge holding portion 102 includes an n-type semiconductor region serving as a charge holding region, and a p-type semiconductor region is disposed between the n-type semiconductor region of the charge holding portion 102 and the surface of the semiconductor layer 10. The p-type semiconductor region on the charge holding portion 102 suppresses mixing of noise charge (dark current) generated on the surface of the semiconductor layer 10 into the n-type semiconductor region of the charge holding portion 102.

The plurality of gate electrodes 20 are provided on the semiconductor region serving as the channel region. Each of the gate electrodes 20 is, for example, a polysilicon electrode, but a part thereof or an entirety thereof may be formed of metal or a metal compound. The plurality of gate electrodes 20 include gate electrodes 202, 203, 204, 205, and 206. The gate electrode 202 constitutes the transfer gate GS, and the gate electrode 203 constitutes the transfer gate TX. Therefore, it is possible to refer to the gate electrodes 202 and 203 as transfer electrodes. The gate electrode 204 constitutes the reset transistor RS, the gate electrode 205 constitutes the amplification transistor SF, and the gate electrode 206 constitutes the selection transistor SL. The semiconductor region 104 functions as a drain of the amplification transistor SF, the semiconductor region 105 functions as a source of the amplification transistor SF, and the semiconductor region 106 functions as a source of the selection transistor SL.

The light-shielding film 30 is a metal film whose main component is metal such as tungsten. A thickness of the light-shielding film 30 is, for example, 110 to 240 nm. As illustrated in FIG. 2A, the light-shielding film 30 has openings 301, 302, 303, and 304, but covers most of the pixel circuit PXC. The opening 301 is positioned above the photoelectric conversion portion 101, and the opening 302 is positioned above the gate electrode 202. The photoelectric conversion portion 101 is able to receive light via the opening 301. The opening 303 is positioned above the gate electrode 203, the charge detection portion 103, the semiconductor region 104, and the gate electrode 205. The opening 304 is positioned above the gate electrode 206 and the semiconductor region 106. As illustrated in FIG. 2A, the light-shielding film 30 has a part 312 that covers the charge holding portion 102 and a part that covers the gate electrode 20. Additionally, the light shielding film 30 also has a part that covers a semiconductor region of the transistor, a part 311 that covers a part of the photoelectric conversion portion 101, and a part 310 that covers the element isolation region 11. In FIG. 2B, the part 311 of the light-shielding film 30, which covers the photoelectric conversion portion 101, the part 312 thereof which covers the charge holding portion 102, a part 325 thereof which covers the gate electrode 205, a part 315 thereof which covers the semiconductor region 105, and the part 310 thereof which covers the element isolation region 11 are illustrated. The light-shielding film 30 includes parts that cover the semiconductor regions, which means that the light-shielding film 30 is continuous between the parts that cover the semiconductor regions.

Although details will be described below, in the present embodiment, a way of optimizing an electrostatic capacitance between the light-shielding film 30 and the gate electrode 20 is devised. The electrostatic capacitance is also referred to as a parasitic capacitance, and a parasitic capacitance due to the light-shielding film 30 affects an operation of the pixel circuit PXC and disturbs improvement of performance of the photoelectric conversion apparatus APR. In particular, a capacitance of the charge detection capacitance FD is a conversion coefficient (gain) of charge-voltage conversion (V=Q/C) of an input of the amplification transistor SF, and an important factor for improving performance of the pixel circuit PXC. By reducing the capacitance of the charge detection capacitance FD to thereby increase the conversion coefficient, it is possible to enhance gradation of a signal of low luminance, and to reduce dark noise. Moreover, it is possible to improve S/N in the signal processing circuit in a following stage of the pixel circuit PXC. For the gate electrodes 20 other than the amplification transistor SF, it is possible to increase a switching speed of ON/OFF of the gate and improve an operation speed of the pixel circuit PXC.

An interlayer insulating film 17 is provided on the light-shielding film 30. Thus, the light-shielding film 30 is positioned between the interlayer insulating film 17 and the semiconductor layer 10. The interlayer insulating film 17 includes, for example, Si (silicon) and O (oxygen), and may further include at least one of B (boron) and P (phosphorus). A dielectric layer 14 may be formed of a glass material. In the interlayer insulating film 17, a plurality of contact holes (holes) are provided, and each of a plurality of contact plugs 40 is disposed in a corresponding one of the plurality of contact holes. The plurality of contact plugs 40 are in contact with the interlayer insulating film 17 that has the contact holes in each of which the corresponding one of the plurality of contact plugs 40 is provided. As illustrated in FIG. 2B, the plurality of contact plugs 40 include contact plugs 422, 423, 413, 424, 414, 425, 426, and 416. The contact plug 422 is connected to the gate electrode 202, the contact plug 423 is connected to the gate electrode 203, and the contact plug 413 is connected to the charge detection portion 103. The contact plug 424 is connected to the gate electrode 204, the contact plug 414 is connected to the semiconductor region 104, and the contact plug 425 is connected to the gate electrode 205. The contact plug 426 is connected to the gate electrode 206, and the contact plug 416 is connected to the semiconductor region 106. The contact plug 422 is provided in the opening 302 of the light-shielding film 30. The contact plugs 423, 413, 424, 414, and 425 are provided in the opening 303 of the light-shielding film 30. The contact plugs 426 and 416 are provided in the opening 304 of the light-shielding film 30. In this manner, the openings 302, 303, and 304 of the light-shielding film 30 are provided for arranging the contact plugs 40 therein. Since the interlayer insulating film 17 is positioned between the contact plugs 40 and the light-shielding film 30 in the openings 302, 303, and 304, insulation between the contact plugs 40 and the light-shielding film 30 is secured.

A wiring layer 50 is provided above the interlayer insulating film 17 and the contact plugs 40 (contact plugs 422, 423, 413, 424, 414, 425, 426, and 416). The wiring layer 50 of the present example is a copper wiring layer whose main component is copper, but may be an aluminum wiring layer whose main component is aluminum. The metal (for example, tungsten) which is the main component of the light-shielding film 30 is different from metal (for example, copper or aluminum) which is the main component of the wiring layer 50. By making the main component of the light-shielding film 30 and the main component of the wiring layer 50 different, it is possible to suppress contamination of the semiconductor layer 10. The wiring layer 50 includes a plurality of wires (wiring patterns) each of which is connected to any one of the contact plugs 422, 423, 413, 424, 414, 425, 426, and 416. Among the plurality of wires included in the wiring layer 50, a wire (local wire) that connects the contact plug 423 and the contact plug 425 is included. The contact plugs 422, 413, 424, 414, 426, and 416 are connected to a global wire such as a drive signal line, a power supply line, or a signal output line.

A dielectric film 13 is provided so as to continuously cover each semiconductor region of the semiconductor layer 10 and the gate electrodes 202, 203, 204, 205, and 206. The dielectric film 13 is desired to be a silicon nitride film. A thickness of the dielectric film 13 is, for example, 20 to 200 nm, and desired to be 25 to 100 nm. The dielectric film 13 that is a silicon nitride layer has various functions. The dielectric film 13 may have a function of diffusion prevention for suppressing diffusion of the metal of the light-shielding film 30 into the semiconductor layer 10. A part of the dielectric film 13, which is positioned above the photoelectric conversion portion 101, may have a function of reflection prevention for reducing reflection of light incident on the photoelectric conversion portion 101. The dielectric film 13 may function as an etching stopper at a time of forming the contact holes in which the contact plugs 40 are disposed.

An insulator layer 12 is provided between the dielectric film 13 and the photoelectric conversion portion 101. The insulator layer 12 is desired to be a silicon oxide layer. A thickness of the insulator layer 12 may be thinner than the thickness of the dielectric film 13. The thickness of the insulator layer 12 is, for example, 5 to 50 nm, and desired to be 5 to 20 nm. The insulator layer 12 may be provided also between the dielectric film 13 and the charge holding portion 102, the charge detection portion 103, the semiconductor regions 104, 105, and 106, and the element isolation region 11. The insulator layer 12 may function as a buffer layer between the dielectric film 13 that is the silicon nitride layer and the semiconductor layer 10 and the gate electrodes 20. The insulator layer 12 extends between the dielectric film 13 and upper surfaces and side surfaces of the gate electrodes 202, 203, 204, 205, and 206. The insulator layer 12 is able to be provided between the dielectric film 13 and the gate electrodes 202, 203, 204, 205, and 206 so as to continuously cover the gate electrodes 202, 203, 204, 205, and 206.

The dielectric layer 14 is provided between the dielectric film 13 and the light-shielding film 30. In other words, the dielectric film 13 is positioned between the dielectric layer 14 and the semiconductor layer 10. A relative dielectric constant ε1 of the dielectric layer 14 is desired to be lower than a relative dielectric constant ε2 of the interlayer insulating film 17 (ε1<ε2). Moreover, the relative dielectric constant ε1 of the dielectric layer 14 is desired to be lower than a relative dielectric constant ε3 of the dielectric film 13 (ε1<ε3). Furthermore, the relative dielectric constant ε1 of the dielectric layer 14 is desired to be lower than a relative dielectric constant ε4 of the insulator layer 12 (ε1<ε4). In a case where the relative dielectric constant ε3 of the dielectric film 13 is higher than the relative dielectric constant ε2 of the interlayer insulating film 17, it is more effective to lower the relative dielectric constant ε1 of the dielectric layer 14. The relative dielectric constant ε2 of the interlayer insulating film 17 may be higher than the relative dielectric constant ε4 of the insulator layer 12. Typically, a relation of ε1<ε4<ε2<ε3 may be satisfied.

The dielectric layer 14 is formed of, for example, a publicly known low-k material. The low-k material here is a dielectric material whose relative dielectric constant is less than 3.8. A relative dielectric constant of silicon oxide is about 3.9 to 4.2, and it is also possible to say that the low-k material is a material whose relative dielectric constant is lower than that of the silicon oxide. The dielectric layer 14 includes, for example, Si (silicon) and O (oxygen), and may further include at least one of C (carbon) and F (fluorine). The dielectric layer 14 may be formed of an organic polymer material. Note that, as the relative dielectric constant ε1 of the dielectric layer 14 is lower, it is possible to reduce a parasitic capacitance more, and the relative dielectric constant ε1 is desired to be equal to or less than 3.5. However, it is possible to appropriately select a material of the dielectric layer 14 by taking stability and thermal durability of the dielectric layer 14 itself, influence such as contamination in the semiconductor layer 10, and the like into consideration. For appropriately selecting the material of the dielectric layer 14, the relative dielectric constant ε1 may be equal to or more than 2.0. Note that, the relative dielectric constant ε2 of the interlayer insulating film 17 may be less than 3.8, may be equal to or more than 3.8, and may be about 4.0 to 6.0. The relative dielectric constant ε3 of the dielectric film 13 may be not less than 7.0 and not more than 8.0. The relative dielectric constant ε4 of the insulator layer 12 may be not less than 3.8 and not more than 4.3.

Moreover, a refractive index of the dielectric layer 14 may be higher than a refractive index of the dielectric film 13 and equal to or less than a refractive index of the interlayer insulating film 17. When the dielectric layer 14 has a refractive index which is close to that of the interlayer insulating film 17 above the photoelectric conversion portion 101, it is possible to suppress loss of an amount of light that reaches the photoelectric conversion portion 101. Moreover, the dielectric layer 14 may include an opening (not illustrated) above the photoelectric conversion portion 101. Thereby, it is possible to suppress reflection by each interface between the dielectric layer 14 and an upper layer or a lower layer of the dielectric layer 14 (for example, the interlayer insulating film 17 or the dielectric film 13). In a case where the dielectric layer 14 has a refractive index which is lower than that of the interlayer insulating film 17, it is possible to secure a high light-shielding property for the semiconductor region 105 covered by the part 315, the element isolation region 11 covered by the part 310, and an edge portion of the photoelectric conversion portion 101, which is covered by the part 311. As a result, it is possible to suppress entrance of light that has passed through the semiconductor region 105, the element isolation region 11, or the photoelectric conversion portion 101 into the charge holding portion 102, and enhance image quality of an image captured by a global electronic shutter. The dielectric layer 14 may exist only under the light-shielding film 30.

A thickness of the dielectric layer 14 is, for example, 20 to 80 nm. The dielectric layer 14 may have a function of flattening a ground of the light-shielding film 30. Accordingly, it is desired that the thickness of the dielectric layer 14 is thicker than the thickness of the dielectric film 13.

As understood from FIG. 2B, a distance between a part of the semiconductor layer 10, on which no gate electrode 20 is provided, and the light-shielding film 30 corresponds to thicknesses of the insulator layer 12 and the dielectric layer 14 between the surface of the semiconductor layer 10 and the light-shielding film 30. Note that, the distance to the light-shielding film 30 means a distance to a lower surface of the light-shielding film 30. In the present example, a sum of the thickness of the insulator layer 12, the thickness of the dielectric film 13, and the thickness of the dielectric layer 14 is coincident with the distance between the surface of the semiconductor layer 10 and the light-shielding film 30. In a case where there is a different insulator layer, a distance to which a thickness of the different insulator layer is added is coincident with the distance between the surface of the semiconductor layer 10 and the light-shielding film 30.

FIG. 2B illustrates a distance D1 between the part 311 of the light-shielding film 30, which covers the photoelectric conversion portion 101, and the semiconductor layer 10, a distance D2 between the part 312 of the light-shielding film 30, which covers the charge holding portion 102, and the semiconductor layer 10, a distance D4 between the part 315 of the light-shielding film 30, which covers the semiconductor region 105, and the semiconductor layer 10, and a distance D5 between the part 310 of the light-shielding film 30, which covers the element isolation region 11, and the element isolation region 11. In the present example, the distances D1, D2, D4, and D5 are equal to each other, and generically called as a distance Dsub (distance Dsub=D1, D2, D4, D5). The distance Dsub is desired to be larger than zero (Dsub>0). This is because contamination in the semiconductor layer 10 due to a metal component or the like of the light-shielding film 30 is suppressed. Since the insulator layer 12, the dielectric film 13, and the dielectric layer 14 are positioned between the parts 311, 312, or 315 of the light-shielding film 30 and the semiconductor layer 10, the distance Dsub corresponds to the sum of the thicknesses of the insulator layer 12, the dielectric film 13, and the dielectric layer 14. The distance Dsub is, for example, 25 to 250 nm, and desired to be 50 to 250 nm.

A distance between the semiconductor layer 10 and a part of the light-shielding film 30, which covers the gate electrode 20, corresponds to a sum of the thicknesses of the insulator layer 12 and the dielectric layer 14 between an upper surface of the gate electrode 20 and the light-shielding film 30 and a thickness of the gate electrode 20. FIG. 2B illustrates a distance D3 between the part 325 of the light-shielding film 30, which covers an upper surface of the gate electrode 205, and the semiconductor layer 10. Note that, a distance Dgt between an upper surface of each of the plurality of gate electrodes 20 such as the gate electrodes 202, 203, 204, and 206 and the light-shielding film 30 may be regarded as equal to the distance Dsub (Dgt=Dsub). The distance Dgt is, for example, 50 to 500 nm, and desired to be 50 to 250 nm.

The distance D2 between the part 312 and the semiconductor layer 10 is shorter than the distance D3 between the part 325 and the semiconductor layer 10 (D2<D3). A difference between the distance D3 and the distance D2 results from the thickness of the gate electrode 20. Thereby, it is possible to secure a high light-shielding property for the charge holding portion 102 covered by the part 312.

Moreover, the distance D3 between the part 325 and the semiconductor layer 10 is longer than the distance D4 between the part 315 that covers the semiconductor region 105 and the semiconductor layer 10 (D4<D3). The distance D5 between the part 310 that covers the element isolation region 11 and the element isolation region 11 is shorter than the distance D3 between the part 325 and the semiconductor layer 10 (D5<D3). The distance D1 between the part 311 that covers the photoelectric conversion portion 101 and the semiconductor layer 10 is shorter than the distance D3 between the part 325 and the semiconductor layer 10 (D1<D3). Thereby, it is possible to secure the high light-shielding property for the semiconductor region 105 covered by the part 315, the element isolation region 11 covered by the part 310, and the edge portion of the photoelectric conversion portion 101, which is covered by the part 311, while a parasitic capacitance generated in the gate electrode 205 is reduced. As a result, it is possible to suppress entrance of light that has passed through the semiconductor region 105, the element isolation region 11, or the photoelectric conversion portion 101 into the charge holding portion 102, and enhance image quality of an image captured by a global electronic shutter.

A structure between the upper surface of the gate electrode 205 and the part 325 of the light-shielding film 30 has been described here. Since a parasitic capacitance to the gate electrode 205 directly affects the conversion coefficient of charge-voltage conversion (V=Q/C), it is desired that the structure between the upper surface of the gate electrode 205 and the part 325 of the light-shielding film 30 is the aforementioned structure having a low relative dielectric constant. A parasitic capacitance to each of the gate electrodes 202, 203, 204, and 206 other than the gate electrode 205 may reduce a switching speed of a gate. Therefore, it is desired that a structure between the upper surface of each of the gate electrodes 202, 203, 204, and 206 and the light-shielding film 30 has a low relative dielectric constant similarly. This is realized by extending the dielectric layer 14 formed of the low-k material between the light-shielding film 30 and each of the gate electrodes 202, 203, 204, and 206.

Furthermore, a difference of the distance D3 between the part 325 and the semiconductor layer 10 and the distance D1 between the part 311 and the semiconductor layer 10 (D3-D1) may be different from a thickness Tg of the gate electrode 20 such as the gate electrode 205, but is the same in the present example. When the difference of the distance D3 and the distance D1 is extremely large, a height difference of unevenness generated in the light-shielding film 30 becomes large, so that reflected light by the light-shielding film 30 becomes stray light or a step cut is easily caused in the light-shielding film 30. When the difference of the distance D3 and the distance D1 is equal to or less than twice of the thickness Tg of the gate electrode 20, it is possible to make a shape of an upper surface of the light-shielding film 30 excellent.

Similarly to the distance D4, a distance between the semiconductor region 104 serving as the drain of the amplification transistor SF and the light-shielding film 30 also may be shorter than the distance D3. Moreover, a distance between a source or a drain of each of the other transistors and the light-shielding film 30 also may be shorter than a distance between the gate electrode of the corresponding transistor and the light-shielding film 30.

Making a distance Dgs between each of the parts 311, 312, and 315 of the light-shielding film 30 and a side surface of the gate electrode 20 longer than the distance Dsub is effective for reducing a parasitic capacitance to the gate electrode 20. The distance Dgt may be shorter or longer than the distance Dgs. When an area of the upper surface of the gate electrode 20 is larger than a total area of the side surfaces of the gate electrode 20 (sum of areas of the four side surfaces), the distance Dgt is desired to be longer than the distance Dgs. When the area of the upper surface of the gate electrode 20 is smaller than the total area of the side surfaces of the gate electrode 20, the distance Dgt is desired to be shorter than the distance Dgs.

As above, by satisfying the relative dielectric constant ε1<the relative dielectric constant ε2, it is possible to reduce the parasitic capacitance to the gate electrode 20 to thereby improve the performance of the pixel circuit PXC.

In addition thereto, a devised way of improving the performance of the pixel circuit PXC will be described. Since the opening 303 of the light-shielding film 30 is positioned above the charge detection portion 103, the light-shielding film 30 does not overlap with the charge detection portion 103 by an amount of the opening 303, so that it is possible to reduce a parasitic capacitance of the light-shielding film 30 to the charge detection portion 103. Similarly, since the opening 303 of the light-shielding film 30 is positioned above the gate electrode 205, the light-shielding film 30 does not overlap with the gate electrode 205 by an amount of the opening 303, so that it is possible to reduce a parasitic capacitance of the light-shielding film 30 to the gate electrode 205. The opening 302 is positioned above the gate electrode 202 and the opening 304 is positioned above the gate electrode 206, so that the similar is applied thereto.

Note that, even when the opening 303 is not provided, it is possible to connect the gate electrode 205 to the charge detection portion 103, and the gate electrode 205 may be in contact with the charge detection portion 103 by extending the gate electrode 205 without using the contact plug 423. However, in this case, an area in which the extended gate electrode 205 and the light-shielding film 30 overlap becomes large, and thus it becomes difficult to sufficiently reduce the parasitic capacitance. In the present embodiment, the contact plug 425 connected to the gate electrode 205 and the contact plug 423 connected to the charge detection portion 103 are arranged in the same opening 303. This is also effective for reducing a parasitic capacitance between each of the contact plugs 423 and 425 and the light-shielding film 30 and reducing a capacitance of the charge detection capacitance FD.

Since an edge surface of the light-shielding film 30, which demarcates the opening 303, is positioned above the upper surface of the gate electrode 205 to thereby enlarge a light-shielded region, a light-shielding property is improved. Similarly, the edge surface of the light-shielding film 30, which demarcates the opening 303, is positioned also above the upper surfaces of the gate electrodes 203 and 204. An edge surface of the light-shielding film 30, which demarcates the opening 302, is positioned above the upper surface of the gate electrode 202, and an edge surface of the light-shielding film 30, which demarcates the opening 304, is positioned above the upper surface of the gate electrode 206.

In this manner, enhancing a light-shielding property of a semiconductor region other than the charge holding portion 102 is effective particularly in a case where the semiconductor region other than the charge holding portion 102 is arranged near the photoelectric conversion portion 101. As is shown from FIG. 2A, no transistor is disposed between each of the gate electrodes 204 and 205 and the photoelectric conversion portion 101. The gate electrode 203 is not positioned on at least one straight line that connects the gate electrodes 204 and 205 and the gate electrode 202. It should be noted that the sectional view illustrated in FIG. 2B is the sectional view taken along the curved line IIB-IIB in FIG. 2A.

A manufacturing method of the photoelectric conversion apparatus APR illustrated in FIGS. 2A and 2B will be described by using FIGS. 3A to 3F.

Figure 3A:
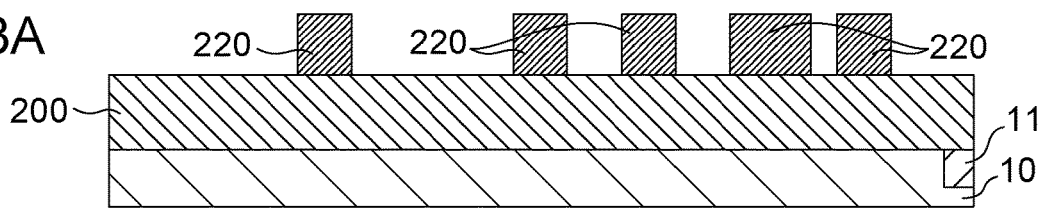
FIGS. 3A to 3F are schematic views for explaining a manufacturing method of the photoelectric conversion apparatus.

In a process a illustrated in FIG. 3A, an element isolation region (not illustrated) and a well region (not illustrated) are formed on a substrate (wafer) that includes the semiconductor layer 10. A gate insulating film (not illustrated) is formed on the semiconductor layer 10, and a conductive film 200 that becomes the gate electrodes 20 is formed on the gate insulating film. The conductive film 200 is, for example, a polysilicon film or an amorphous silicon film. A resist pattern 220 is formed on the conductive film 200 by photolithography.

Figure 3B:
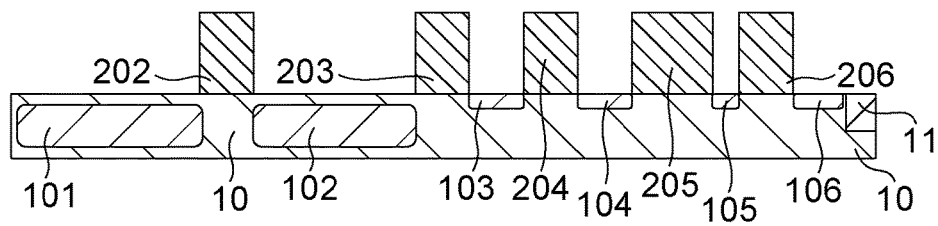

In a process b illustrated in FIG. 3B, by dry etching using the resist pattern 220 as a mask, the conductive film 200 is subjected to patterning. Thereby, the gate electrodes 20 (gate electrodes 202, 203, 204, 205, and 206) are formed.

Figure 3C:
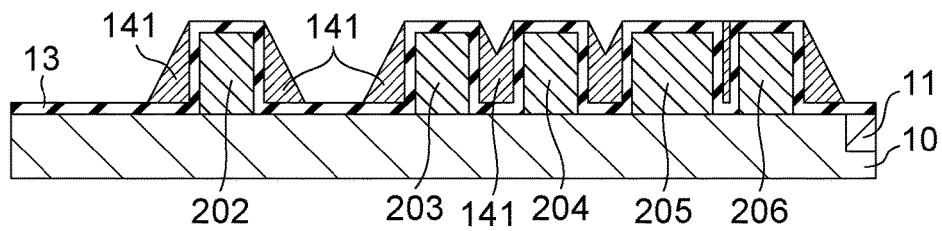

In a process c illustrated in FIG. 3C, the insulator layer 12 (not illustrated) which is a silicon oxide layer is formed on a whole surface, and the dielectric film 13 which is a silicon nitride film is further formed on the insulator layer 12. Then, a first dielectric layer is formed on the dielectric film 13, and a dielectric layer 141 serving as a side wall spacer which covers the side surfaces of the gate electrodes 20 is formed by etching back the first dielectric layer.

Figure 3D:
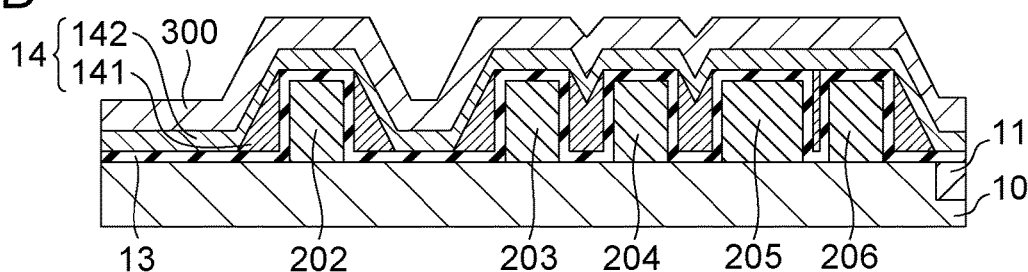

In a process d illustrated in FIG. 3D, a dielectric layer 142 that is formed of a low-k material is laminated on the whole surface so as to cover the dielectric layer 141. What is obtained by combining the dielectric layer 141 and the dielectric layer 142 becomes the dielectric layer 14. Note that, different materials may be used for the dielectric layer 141 and the dielectric layer 142. Furthermore, a metal film 300 such as a tungsten film is formed on the dielectric layer 14. In the present process d, the dielectric layer 141 may have a function of improving coatability (coverage) of the metal film 300 at a time of forming the metal film 300.

Figure 3E:
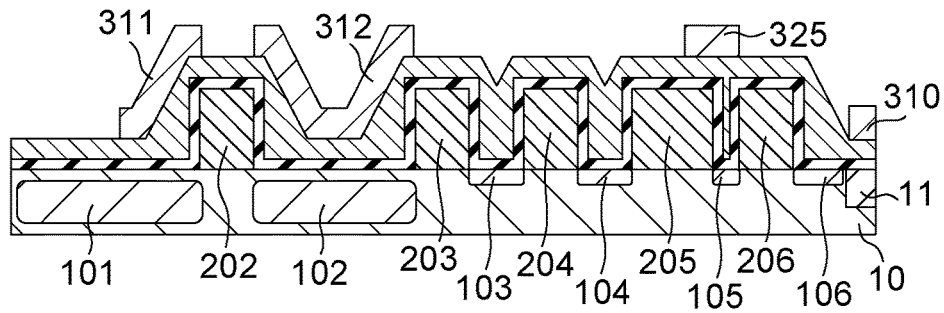

In a process e illustrated in FIG. 3E, by performing patterning for the metal film 300 by photolithography and dry etching, the light-shielding film 30 that has the predetermined openings is formed. Moreover, in the present process e, the dielectric layer 142 may function as a protecting layer that prevents the dielectric film 13 from being subjected to etching at a time of dry etching of the metal film 300. Although there is a possibility that, when the thickness of the dielectric film 13 changes due to the etching, reflection prevention performance of the dielectric film 13 is deteriorated, by providing the dielectric layer 14 (dielectric layer 142), it is possible to improve an optical characteristic.

Figure 3F:
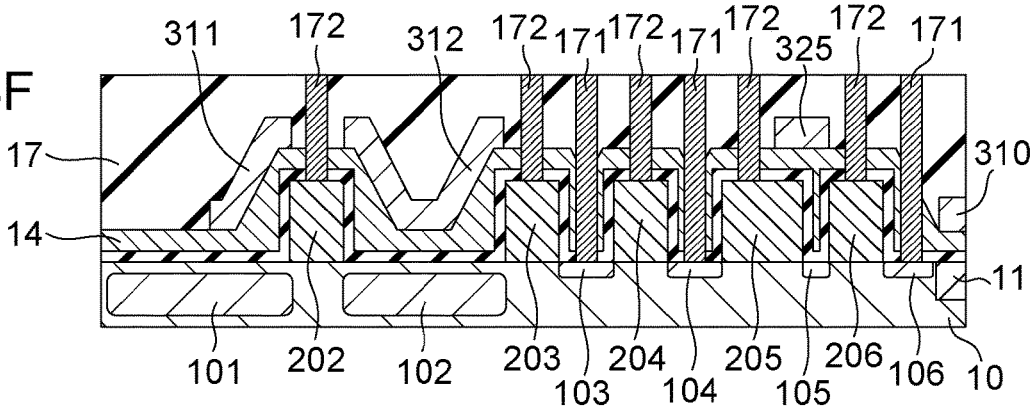

In a process f illustrated in FIG. 3F, the interlayer insulating film 17 such as a silicon oxide layer is formed on the light-shielding film 30, and, as necessary, the interlayer insulating film 17 is flattened by using a polishing method such as a CMP method. A plurality of contact holes 171 and 172 are formed in the interlayer insulating film 17. The contact holes 171 reach the semiconductor layer 10, and the contact holes 172 reach the gate electrodes 20. The dielectric film 13 may function as a temporary etching stopper at a time of forming the contact holes 171 and 172 in the interlayer insulating film 17.

Thereafter, each of the contact plugs 40 is formed inside a corresponding one of the contact holes 171 and 172 of the interlayer insulating film 17. Then, an interlayer insulating film 19 is formed on the interlayer insulating film 17 and the contact holes 171 and 172. A trench is formed in the interlayer insulating film 19 so as to expose each of the contact holes 171 and 172, a conductive material such as copper is filled in the trench, and an excessive conductive material outside the trench is polished and removed. In this manner, the wiring layer 50 whose main component is copper is formed by a single damascene method. Thereafter, a necessary number of wiring layers a main component of each of which is copper are formed. Furthermore, as necessary, an optical waveguide, a color filter, or a microlens is formed.

Then, the wafer is subjected to dicing and packed to thereby manufacture the photoelectric conversion apparatus APR.

According to the photoelectric conversion apparatus APR of the present embodiment, it is possible to reduce a parasitic capacitance of the gate electrode 20, which results from the light-shielding film 30, without sacrificing light-shielding of the charge holding portion 102. Thereby, it becomes possible to reduce dark noise and to provide the photoelectric conversion apparatus APR that has an excellent SN ratio.

The equipment EQP illustrated in FIG. 1A will be described in detail. In addition to the semiconductor device IC that includes the semiconductor layer 10, the photoelectric conversion apparatus APR may include the package PKG that accommodates the semiconductor device IC. The package PKG may include a base to which the semiconductor device IC is fixed, a lid such as glass, which faces the semiconductor device IC, and a connecting member such as a bonding wire or a bump, which connects a terminal provided in the base and a terminal provided in the semiconductor device IC.

The equipment EQP may further include at least any one of the optical system OPT, the control apparatus CTRL, the processing apparatus PRCS, the display apparatus DSPL, and the memory apparatus MMRY. The optical system OPT forms an image in the photoelectric conversion apparatus APR, and is, for example, a lens, a shutter, or a mirror. The control apparatus CTRL controls the photoelectric conversion apparatus APR, and is, for example, a photoelectric conversion apparatus such as an ASIC. The processing apparatus PRCS performs processing for a signal output from the photoelectric conversion apparatus APR, and is a photoelectric conversion apparatus such as a CPU or an ASIC, which constitutes an AFE (analog front-end) or a DFE (digital front-end). The display apparatus DSPL is an EL display apparatus or a liquid crystal display apparatus which displays information (image) obtained by the photoelectric conversion apparatus APR. The memory apparatus MMRY is a magnetic device or a semiconductor device which stores information (image) obtained by the photoelectric conversion apparatus APR. The memory apparatus MMRY is a volatile memory such as an SRAM or a DRAM or a nonvolatile memory such as a flash memory or a hard disk drive. The machine apparatus MCHN includes a movable unit or a propelling unit such as a motor or an engine. The equipment EQP displays, on the display apparatus DSPL, a signal output from the photoelectric conversion apparatus APR, and transmits the signal to an outside by a communication apparatus (not illustrated) provided in the equipment EQP. Thus, it is desired that the equipment EQP further includes the memory apparatus MMRY or the processing apparatus PRCS separately from a storage circuit or an operation circuit each of which is included in the photoelectric conversion apparatus APR.

The EQP illustrated in FIG. 1A may be electronic equipment such as an information terminal (for example, a smartphone or a wearable terminal) which includes a photographing function or a camera (for example, a lens interchangeable type camera, a compact camera, a video camera, or a monitoring camera). The machine apparatus MCHN in the camera is able to drive a part of the optical system OPT for zooming, focusing, or a shutter operation. Moreover, the equipment EQP may be transport equipment such as a vehicle, a vessel, or an aircraft. The machine apparatus MCHN in the transport equipment may be used as a moving apparatus. The equipment EQP as the transport equipment is suitable for one that transports the photoelectric conversion apparatus APR or one that assists and/or automates an operation (manipulation) by a photographing function. The processing apparatus PRCS for assisting and/or automating the operation (manipulation) is able to perform processing for operating the machine apparatus MCHN as the moving apparatus on the basis of information obtained by the photoelectric conversion apparatus APR.

By using the photoelectric conversion apparatus APR according to the present embodiment, it is possible to enhance image quality of an image obtained by a global electronic shutter. Therefore, when the photoelectric conversion apparatus APR is mounted on transport equipment and thereby an outside of the transport equipment is photographed or an external environment is measured, it is possible to obtain excellent image quality or measurement accuracy. Moreover, it is possible to improve reliability so as to mount the photoelectric conversion apparatus APR on the transport equipment. Thus, for manufacturing or selling the transport equipment, deciding to mount the photoelectric conversion apparatus APR of the present embodiment on the transport equipment is advantageous to enhance performance of the transport equipment.

The embodiment described as above is able to be modified as appropriate within a range that does not depart from technical idea. Note that, contents disclosed in the embodiment is not limited to what is specified in the present application, and includes all matters that are able to be grasped from the present application and the drawings attached to the present application.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2017-199604 filed Oct. 13, 2017, which is hereby incorporated by reference herein in its entirety.

What is claimed is:

1. A photoelectric conversion apparatus comprising:
a semiconductor layer that includes a photoelectric conversion portion, a charge holding portion which holds electric charge generated by the photoelectric conversion portion, and a charge detection portion to which the electric charge held by the charge holding portion is transferred;
a gate electrode of a transistor, which is disposed on the semiconductor layer;
an insulator film that covers the semiconductor layer and has a contact hole positioned above the gate electrode;
a contact plug that is disposed in the contact hole and connected to the gate electrode, the contact plug being arranged so as to overlap the gate electrode in a plan view;
a light-shielding film that is positioned between an upper surface of the insulator film and an upper surface of the semiconductor layer and includes a first part covering the charge holding portion and a second part covering the gate electrode; and
a dielectric layer that is positioned between the second part and the gate electrode, wherein
a relative dielectric constant of the dielectric layer is lower than a relative dielectric constant of the insulator film.

2. The photoelectric conversion apparatus according to claim 1, wherein
the gate electrode includes an upper surface and a side surface, the second part covers the upper surface of the gate electrode, and the dielectric layer is positioned between the upper surface of the gate electrode and the second part.

3. The photoelectric conversion apparatus according to claim 2, wherein the gate electrode is connected to the charge detection portion.

4. The photoelectric conversion apparatus according to claim 3, wherein a distance between the first part and the semiconductor layer is shorter than a distance between the second part and the semiconductor layer.

5. The photoelectric conversion apparatus according to claim 4, wherein the charge holding portion includes an n-type semiconductor region, and a p-type semiconductor region is disposed between the n-type semiconductor region and a surface of the semiconductor layer.

6. Electronic equipment that includes the photoelectric conversion apparatus according to claim 5, further comprising at least any one of:
an optical system that forms an image in the photoelectric conversion apparatus; a control apparatus that controls the photoelectric conversion apparatus; a processing apparatus that performs processing for a signal output from the photoelectric conversion apparatus; a display apparatus that displays information obtained by the photoelectric conversion apparatus; and a memory apparatus that stores information obtained by the photoelectric conversion apparatus.

7. The photoelectric conversion apparatus according to claim 3, wherein the dielectric layer includes an opening above the photoelectric conversion portion.

8. The photoelectric conversion apparatus according to claim 3, wherein a dielectric film that has a relative dielectric constant higher than the relative dielectric constant of the dielectric layer is provided between the dielectric layer and the gate electrode.

9. The photoelectric conversion apparatus according to claim 3, wherein the light-shielding film is provided with a first opening positioned above the photoelectric conversion portion and a second opening positioned above the charge detection portion.

10. The photoelectric conversion apparatus according to claim 9, wherein a plurality of contact plugs that include the contact plug connected to the gate electrode are provided in the second opening.

11. The photoelectric conversion apparatus according to claim 9, wherein the light-shielding film is provided with a third opening, and a plurality of contact plugs that include the contact plug connected to the gate electrode are provided in the third opening.

12. The photoelectric conversion apparatus according to claim 2, wherein
a first transfer electrode is provided on a semiconductor region between the photoelectric conversion portion and the charge holding portion, and a second transfer electrode is provided on a semiconductor region between the charge holding portion and the charge detection portion,
a plurality of pixel circuits that are two dimensionally arrayed, a pixel circuit of the plurality of pixel circuits including the first transfer electrode, the second transfer electrode, and the gate electrode, and
the transistor is connected to the charge detection portion.

13. The photoelectric conversion apparatus according to claim 1, wherein the light-shielding film includes a third part that covers a semiconductor region constituting a source or a drain of the transistor, the dielectric layer extends between the third part and the semiconductor layer, and the semiconductor region is arranged apart from the photoelectric conversion portion and the charge holding portion.

14. The photoelectric conversion apparatus according to claim 13, wherein the light-shielding film includes a fourth part that covers a part of the photoelectric conversion portion, and the dielectric layer extends between the fourth part and the semiconductor layer.

15. The photoelectric conversion apparatus according to claim 13, wherein the semiconductor region functions also as the source or the drain of the transistor other than the transistor.

16. The photoelectric conversion apparatus according to claim 1, wherein the insulator film and the dielectric layer include Si and O, and the dielectric layer includes at least one of C and F.

17. The photoelectric conversion apparatus according to claim 1, wherein a wiring layer mainly composed of copper is provided on the light-shielding film, and the main component of the light-shielding film is a metal other than copper.

18. Transfer equipment that includes a moving apparatus, further comprising:
the photoelectric conversion apparatus according to claim 1; and a processing apparatus that performs processing by which the moving apparatus is operated on a basis of information obtained by the photoelectric conversion apparatus.

19. A photoelectric conversion apparatus comprising:
a semiconductor layer that includes a photoelectric conversion portion, a charge holding portion which holds electric charge generated by the photoelectric conversion portion, and a charge detection portion to which the electric charge held by the charge holding portion is transferred;
a gate electrode of a transistor, which is disposed on the semiconductor layer;
a light-shielding film that is positioned between an upper surface of an insulator film and an upper surface of the semiconductor layer and includes a first part covering the charge holding portion and a second part covering the gate electrode;
a contact plug that is connected to the gate electrode and that is arranged so as to overlap the gate electrode in a plan view; and
a dielectric layer that is positioned between the second part and the gate electrode, wherein
the dielectric layer is formed of a low-k material.

20. The photoelectric conversion apparatus according to claim 19, wherein the dielectric layer is formed of an organic polymer and/or a relative dielectric constant of the dielectric layer is equal to or less than 3.5.

21. A photoelectric conversion apparatus comprising:
a semiconductor layer that includes a photoelectric conversion portion, a charge holding portion which holds electric charge generated by the photoelectric conversion portion, and a charge detection portion to which the electric charge held by the charge holding portion is transferred;
a gate electrode of a transistor, which is disposed on the semiconductor layer;
an insulator film that covers the semiconductor layer and has a contact hole positioned above the gate electrode;
a contact plug that is disposed in the contact hole and connected to the gate electrode, the contact plug being arranged so as to overlap the gate electrode in a plan view;
a light-shielding film that is positioned between an upper surface of the insulator film and an upper surface of the semiconductor layer and includes a first part covering the charge holding portion and a second part covering the gate electrode; and
a dielectric layer that is positioned between the second part and the gate electrode, wherein
the insulator film includes Si and O, and at least one of B and P, and the dielectric layer includes Si and O, and at least one of C and F.

22. Electronic equipment that includes the photoelectric conversion apparatus according to claim 21, further comprising at least any one of:
an optical system that forms an image in the photoelectric conversion apparatus;
a control apparatus that controls the photoelectric conversion apparatus;
a processing apparatus that performs processing for a signal output from the photoelectric conversion apparatus;
a display apparatus that displays information obtained by the photoelectric conversion apparatus; and
a memory apparatus that stores information obtained by the photoelectric conversion apparatus.

23. Transfer equipment that includes a moving apparatus, further comprising:
the photoelectric conversion apparatus according to claim 21; and
a processing apparatus that performs processing by which the moving apparatus is operated on a basis of information obtained by the photoelectric conversion apparatus.

* * * * *